(12) United States Patent
Bowe et al.

(10) Patent No.: US 6,175,245 B1
(45) Date of Patent: Jan. 16, 2001

(54) CMOS SOI CONTACT INTEGRITY TEST METHOD

(75) Inventors: Nathaniel W. Bowe, Colchester; Ronald D. Rossi, Swanton, both of VT (US)

(73) Assignee: International Business Machines Corporation, Armonk, NY (US)

(*) Notice: Under 35 U.S.C. 154(b), the term of this patent shall be extended for 0 days.

(21) Appl. No.: 09/104,316

(22) Filed: Jun. 25, 1998

(51) Int. Cl.[7] ............................................. G01R 31/26
(52) U.S. Cl. ................................... 324/765; 324/769
(58) Field of Search ................................... 324/765, 769

(56) References Cited

U.S. PATENT DOCUMENTS

| | | | |
|---|---|---|---|
| 4,894,605 | 1/1990 | Ringleb et al. | 324/537 |
| 5,014,003 | 5/1991 | Ishikawa | 324/158 |
| 5,061,894 | 10/1991 | Ikeda | 324/158 |
| 5,206,585 | 4/1993 | Chang et al. | 324/158 |
| 5,412,329 | 5/1995 | Iino et al. | 324/754 |
| 5,420,520 | 5/1995 | Anschel et al. | 324/754 |
| 5,461,327 | 10/1995 | Shibata et al. | 324/760 |
| 5,491,426 | 2/1996 | Small | 324/754 |
| 5,986,461 | * 11/1999 | Kalb, Jr. | 324/765 |
| 6,008,664 | * 12/1999 | Jett et al. | 324/765 |

* cited by examiner

Primary Examiner—Glenn W. Brown
(74) Attorney, Agent, or Firm—James M. Leas

(57) ABSTRACT

A method has been found to check contact to chips having inputs lacking a diode to substrate, such as silicon on insulator (SOI) chips. A mid level voltage, such as Vdd/2, is applied to each receiver sequentially to partially turn on both complementary devices of a CMOS inverter receiver or to partially turn on a current switch receiver. The overall chip standby leakage current is measured while a receiver is at the mid level voltage. These measurements are compared to the overall chip standby leakage current in normal operation when a logical high or logical low level is applied to all I/O pads. A mid level voltage is enough to partially turn on both complementary devices of an inverter receiver or to partially turn on a current switch receiver and the current going through that one receiver is sufficient to provide a significant increase in the overall chip standby current. Thus by measuring an overall chip Idd current, probe contact is checked for each receiver pad individually without directly accessing a current at each receiver pad.

21 Claims, 9 Drawing Sheets

FIG. 6   current switch receiver

CMOS SOI CONTACT INTEGRITY TEST METHOD

FIELD OF THE INVENTION

This invention generally relates to a method of testing integrated circuit (IC) chips, lore particularly, it relates to a method of ensuring that probes are in good electrical contact with a semiconductor device lacking a resistive or diode electrical path that can be contacted. Even more particularly, it relates to a method of testing IC chips in which devices on the chips have back insulators, such as silicon-on-insulator (SOI) IC chips that prevent formation of diodes to substrate.

BACKGROUND OF THE INVENTION

As a first step in testing an integrated circuit chip probe contact to the chip is usually checked to ensure that good electrical connection has been achieved. FIG. 1a shows a circuit diagram and FIG. 1b shows a cross sectional view of an inverter type of input receiver 18 on a chip formed on a conventional bulk silicon semiconductor wafer. Input pad 20 of integrated circuit chip 22 is connected to gates 24a, 24b of inverter pair 26 of complementary CMOS transistors, including PFET 28a and NFET 28b that make up receiver 18. Input pad 20 and gates 24a, 24b are also connected to diffusion 30 in p-substrate substrate 32 that forms ESD protect diode 34. Probe contact to input pad 20 of chip 22 is easily checked by a technique such as forcing a voltage between pad and substrate probes (not shown) to forward bias protect diode 34, and measuring the resulting current at either probe. Where chip pads on bulk silicon substrates are connected to semiconductor substrate 32 through a diffusion such as diffusion 30 of ESD protect diode 34, contact is most easily checked by looking for the current-voltage characteristic of a forward biased diode between chip pad 10 and substrate 32.

However. some semiconductor technologies save chip real estate by providing inputs without protect devices, and these technologies have essentially floating gates, making the contact check difficult. Other technologies use protect devices that are not easily turned on, such as snap back diodes, and this similarly hinders the contact check. In addition, devices fabricated on material having a back insulator, such as SOI CMOS pair 40 of FIG. 2, are isolated from semiconductor substrate 32 by back insulator 42. CMOS SOI transistors 24a' and 24b' are formed in isolated wells 44a, 44b, and there is generally no well contact brought out. Input pad 20' of the SOI chip is therefore not electrically connected to another available pad through a device, such as a resistor or diffusion, that would enable checking probe contact.

In cases where there has been no diode to forward bias or where no substantial current could be forced between an input pad and the substrate or between any other two pads, there has been no way to distinguish probe contact difficulties from internal causes of chip failure. The solution to this uncertainty has been to simply push harder on the probes and test again. However, a better solution is needed that provides a way to check whether probes are properly electrically connected to chip pads and to determine which of the many probes is not electrically connected, and this solution is provided by the following invention.

SUMMARY OF THE INVENTION

It is therefore an object of the present invention to provide an improved method of checking individual probes and determining whether each probe is actually electrically contacting a pad of a chip.

It is another object of the present invention to provide a method of checking that probes are contacting a chip having input pads tied to floating gates.

It is another object of the present invention to provide a method of checking that probes arc contacting a chip having a back insulator, such as an SOI chip.

It is a feature of the present invention that an individual contact is checked by measuring current drawn through other contacts to the chip.

It is a feature of the present invention that an individual contact is checked by measuring Idd current.

It is an advantage of the present invention that contact is checked without requiring any design or processing steps or added cost in integrated circuit manufacture or test.

It is an advantage of the present invention that false fails as a result of bad contact are avoided when testing chips, such as SOI chips or chips having essentially floating input pads, and the specific probe or probes having a contact problem can be identified for corrective action.

These and other objects, features, and advantages of the invention are accomplished by a method of testing, comprising the steps of:

(a) providing a CMOS integrated circuit chip comprising a plurality of I/O pads for external contact said I/O pads connected to gates of transistors:

(b) providing a logical high or a logical low voltage to all but a first of said plurality of pads and applying an intermediate voltage level exclusively to said first of said pads to partially turn on a first of said transistors; and (c) measuring chip Idd standby current while said intermediate voltage is being provided to said first pad.

BRIEF DESCRIPTION OF THE DRAWINGS

The foregoing and other objects, features and advantages of the invention will be apparent from the following detailed description of the invention, as illustrated in the accompanying drawings in which:

FIG. 1b is a cross sectional view of the circuit of FIG. 1a;

DETAILED DESCRIPTION OF THE INVENTION

Figure 1A:
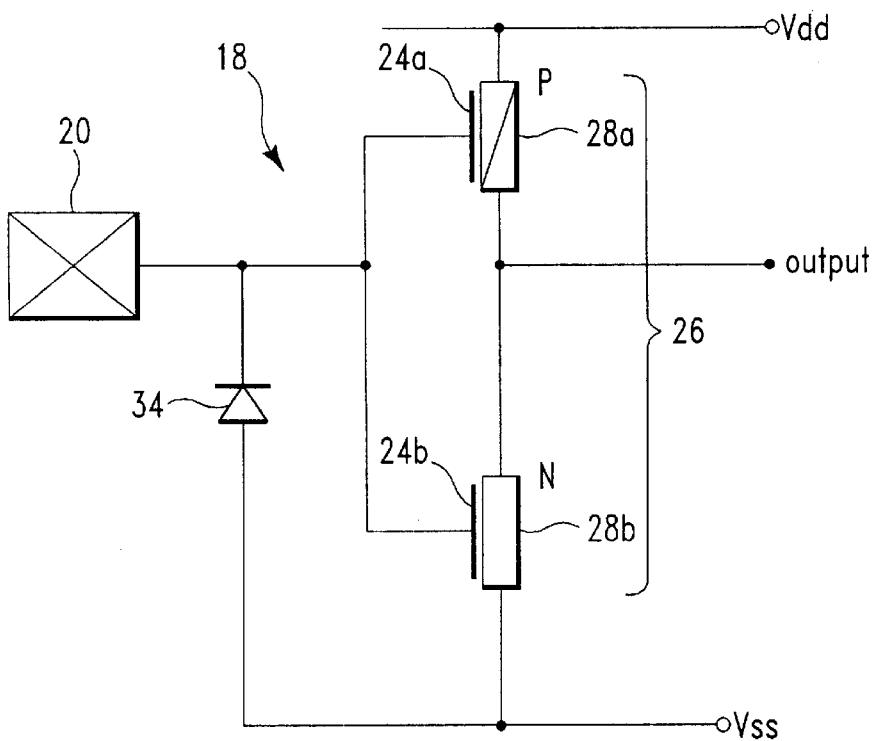
FIG. 1a is a circuit diagram of a conventional CMOS inverter receiver input circuit including a complementary pair of transistors and a protect device in bulk silicon.
Figure 2:
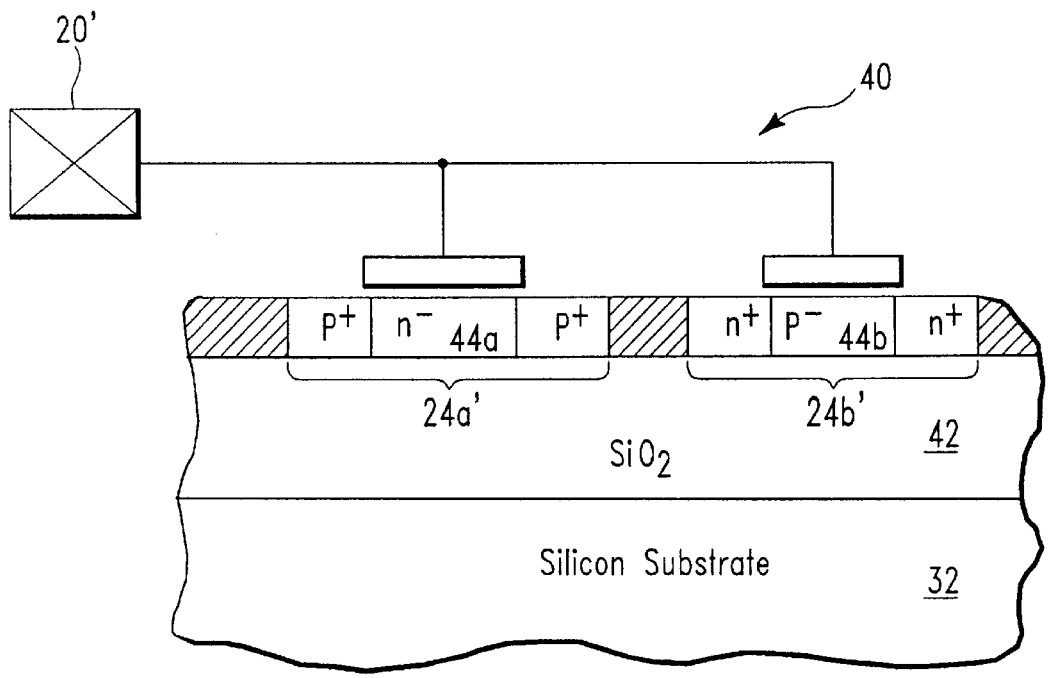
FIG. 2 is a cross sectional view of a conventional CMOS input circuit including a complementary pair of transistors in SOI showing no forward biasable diodes and no means to directly detect probe contact.
Figure 1B:
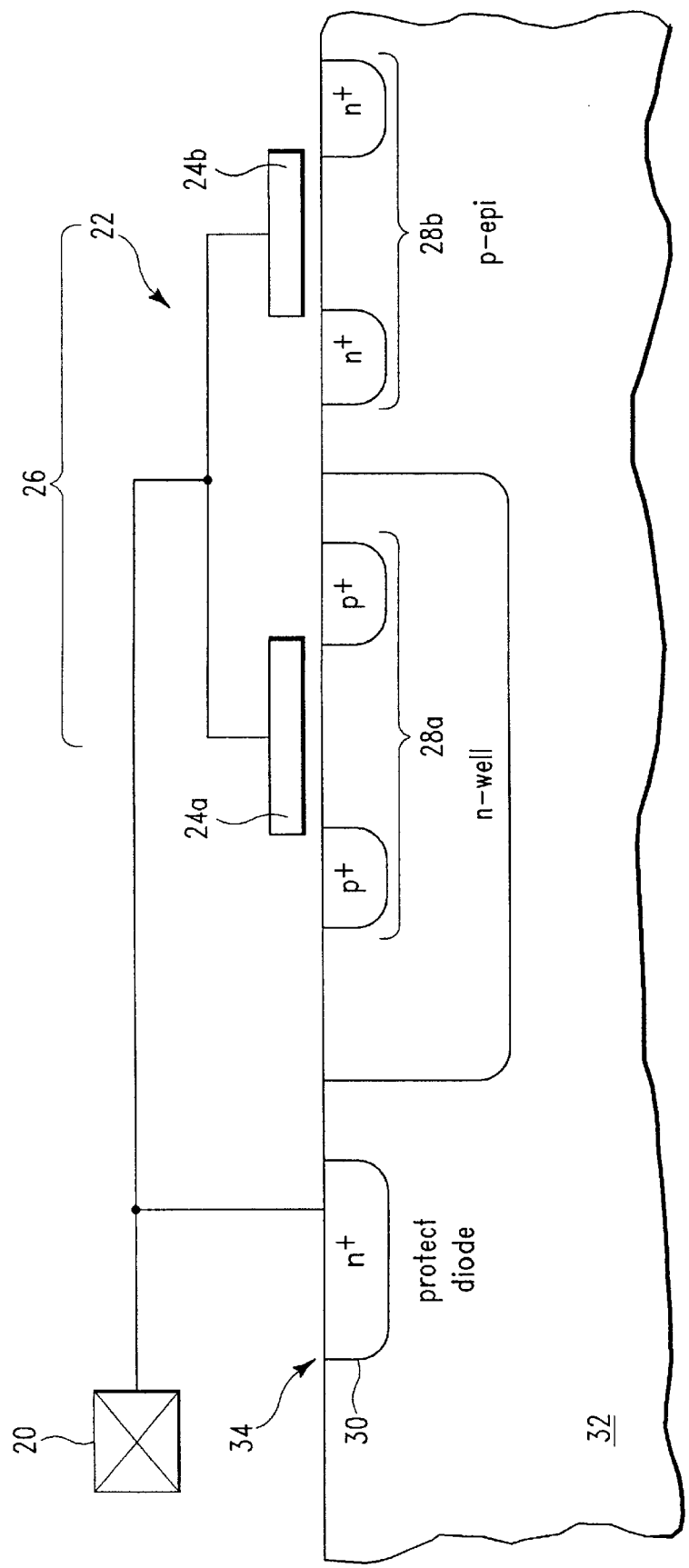

The present invention provides a process for checking contact to chips not having a diode connected between a pad and substrate such as chips having floating gates, snap back diodes for FSD protection, and chips, such as SOI chips, having back insulators. The method permits assurance that good contact has been achieved where the ability to measure a diode forward characteristic curve is lacking, without otherwise compromising circuit or device design.

In the invention, a mid level voltage such as Vdd/2, is applied to each receiver sequentially to partially turn on both complementary devices of the CMOS inverter. The overall chip standby leakage current is measured while an inverter in the receiver is at the mid level voltage. These measurements are compared to the overall chip standby leakage current in normal operation when a rail voltage (or a logic high or logic low level) is applied to all inverters. A mid level voltage is enough to partially turn on both complementary devices of an inverter, and the current going through the two devices from rail to rail is sufficient to provide a significant increase in the overall chip standby current. Thus, by measuring an overall chip Idd current, probe contact is checked for each receiver pad individually without directly accessing a current at each receiver pad.

The present inventors found that, although there are millions of CMOS pairs of devices on a chip, it is enough to partially turn on just one of those millions to significantly change chip standby current. All the rest of the CMOS pairs have very little leakage current, and therefore the overall Idd current of the chip can be substantially changed when a single CMOS pair is partially turned on by providing that pair with a mid level voltage. Thus, the inventors found that they could detect contact to an SOI CMOS chip by varying pad voltage and measuring current at the power supply pin. They found that the Idd of the whole chip substantially increased when a single input was held at a mid level.

Thus, while the present invention does not provide a way to detect current in each contact probe itself, it does permit checking that each probe is making contact, even if that probe is contacting a pair of complementary CMOS floating gates. If a probe is not making contact the mid level voltage will not cause a change to be detected in chip Idd current. If the probe is making contact a much larger current will be drawn by the entire chip. The particular probe that is not making contact can be identified, individually adjusted, and the measurement repeated.

The present invention provides a way to characterize contact at all kinds of I/O pads, including those for address lines, chip enable, as well as input receivers and input/output pads. Drivers are usually connected to diffusions, so they can usually be characterized by measuring the traditional diode forward characteristic. Alternatively, drivers can be characterized by detecting an output signal from the chip once contact has been verified for input pads.

Figure 3A:
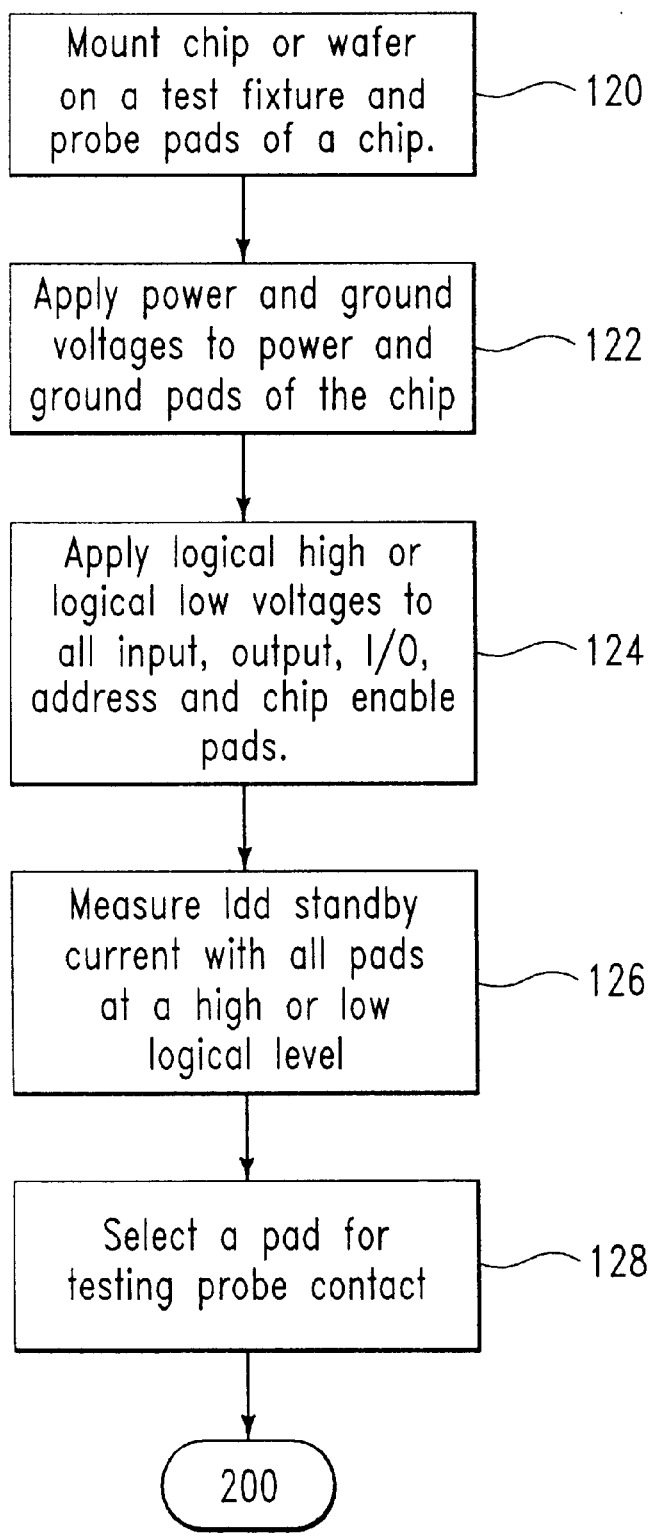
FIGS. 3a–3c are a flow chart of the steps of the present invention.
Figure 3B:
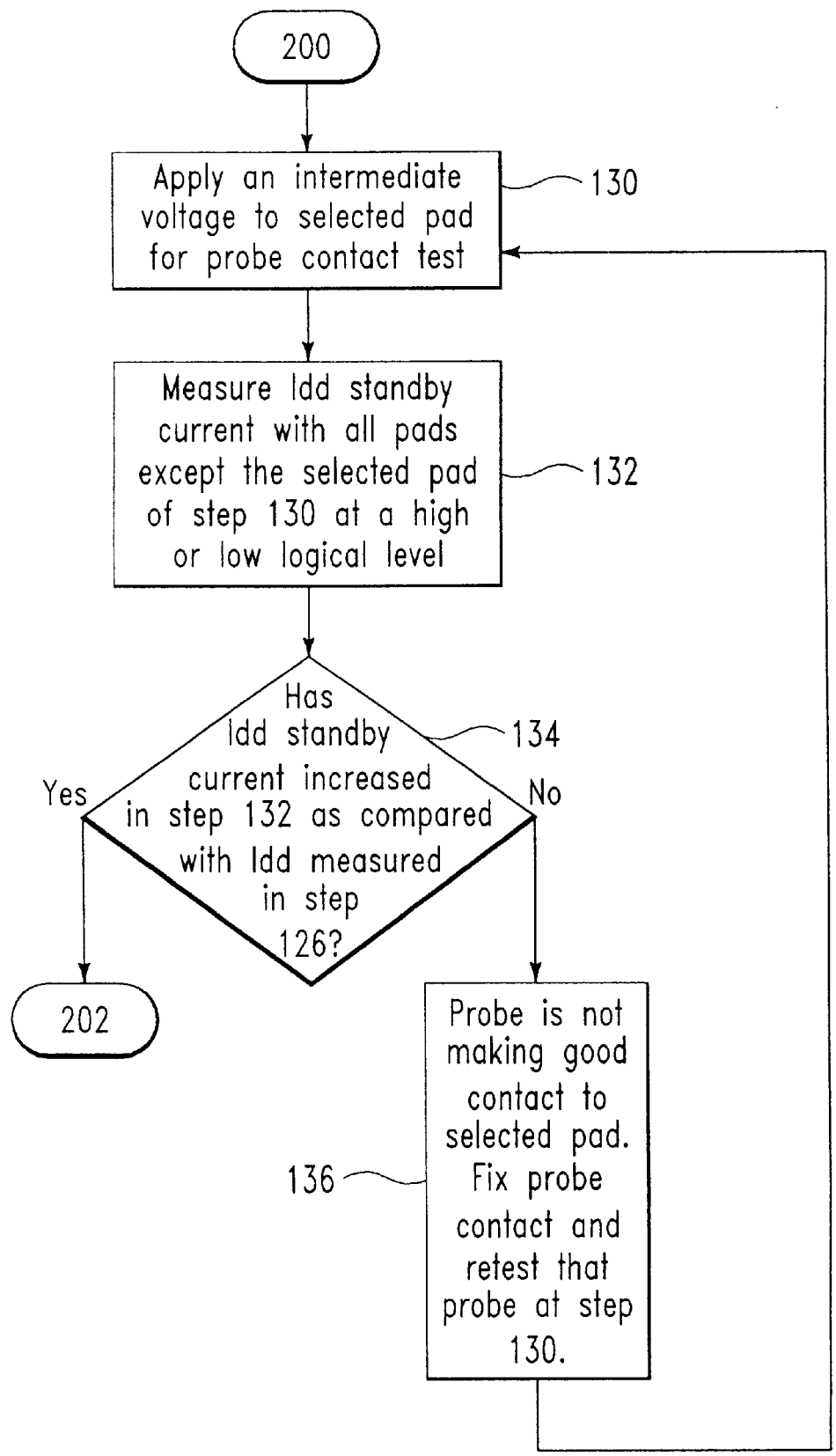
Figure 3C:
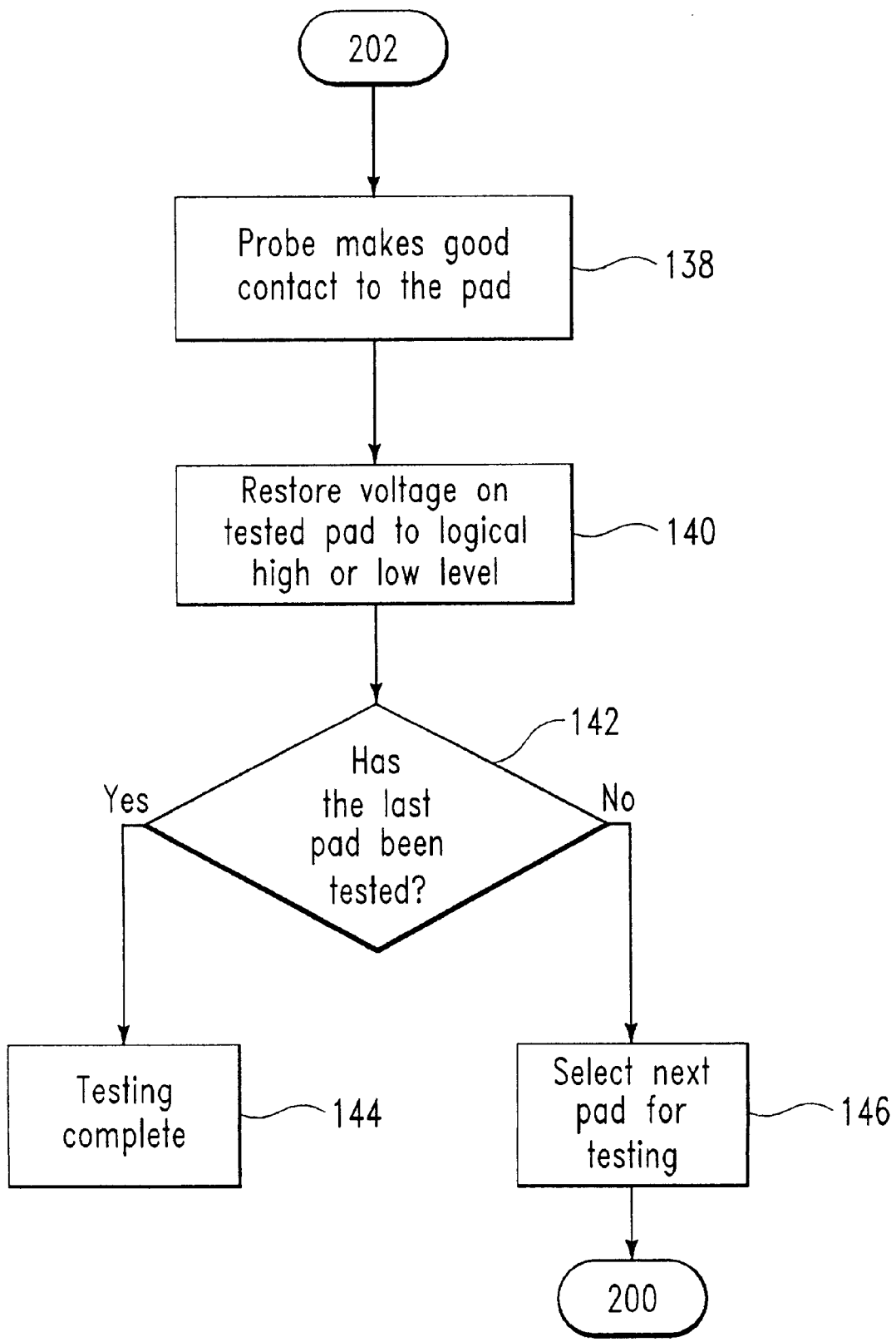

The procedure for practicing the invention is shown in the flow chart of FIGS. 3a–3c. In the first step a wafer or a chip is mounted on a test fixture and contacts of the chip are probed, as shown in box 120 of E IG. 3a. Next power and ground are applied to power and ground pads of the chip, as shown in box 122. Logic high or low voltages are applied to all I/O pads (including input, output, I/O, address, and chip enable pads), as shown in box 124. In the next step, Idd standby current is measured with the I/O pads all at a logical high or low voltage, as shown in box 126. Then, a pad is selected for testing probe contact, as shown in box 128. An intermediate voltage is then applied to the selected I/O pad, as shown in box 130 (FIG. 3b). Idd standby current is measured with all the I/O pads at a logical voltage level except the one being tested, as shown in box 132. As shown in box 34, if the Idd standby current was found to be changed sufficiently in the Idd standby current test of step 132 from the measurement in box 126, then the probe is determined to have made good electrical contact as indicated at box 138 (FIG. 3c). A logical high or low voltage is now provided on the tested pad, as shown in box 140. A determination is made as to whether the selected pad was the last pad needing contact testing, as shown in box 142. If so, testing is complete, as shown in box 144. If not, the next pad is selected for testing, as shown in box 146. Testing resumes on this newly selected pad at box 130 (FIG. 3b) by providing the intermediate voltage to this new I/O pad. However, if in step 134, the Idd stand by current measured instep 132 was not changed from the measurement in box 126, then the probe is determined not to have made good electrical contact, and the chip is found to have failed the contact test for the specified pin as shown in box 136. An adjustment in probes or probe contact is made and testing resumed with an intermediate voltage at step 130 until the Idd current is found to have increased as compared with the measurement of step 126, as shown in step 134.

Figure 4:
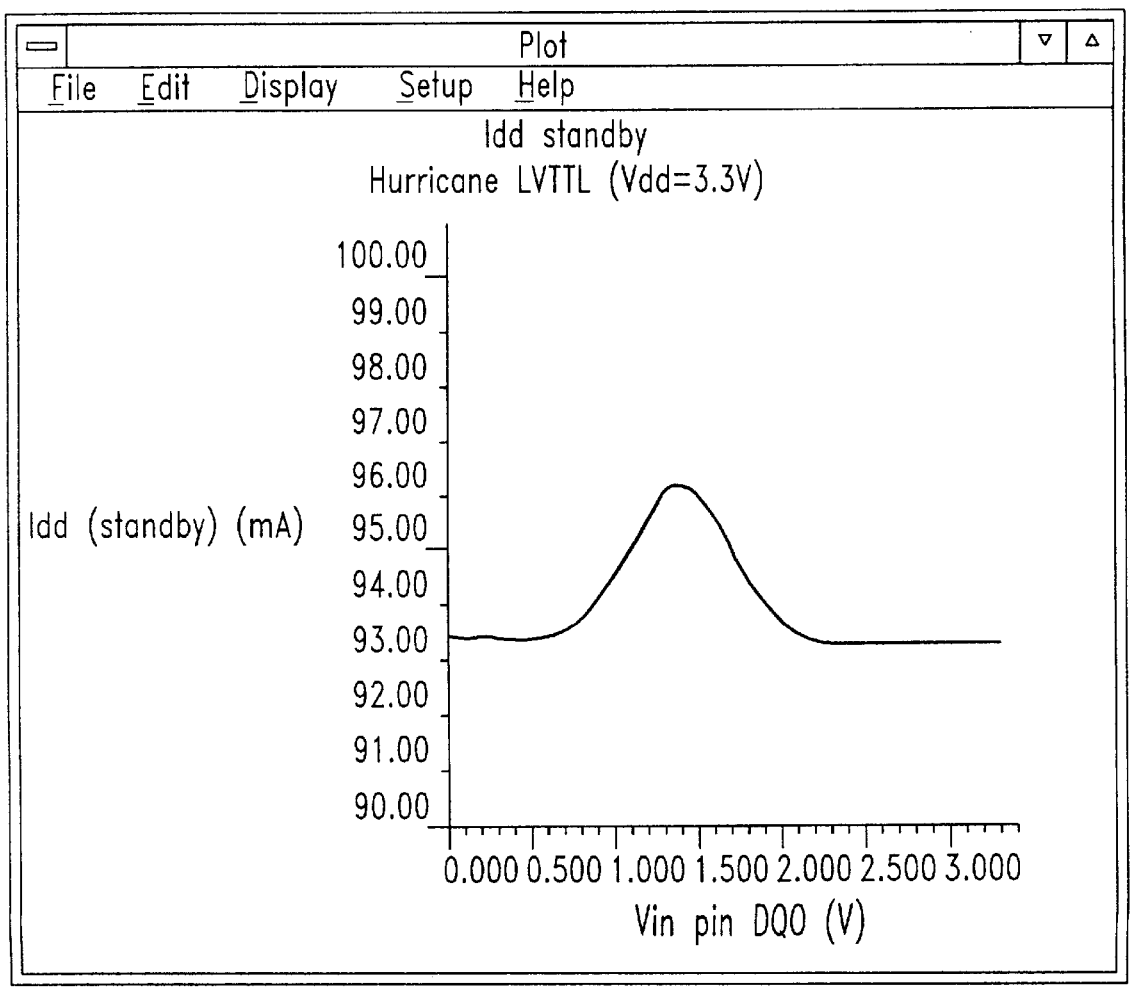
FIG. 4 is a graph showing how Idd current varied with voltage applied to a single input pad having an inverter type receiver on an SRAM chip.

While a range of intermediate voltages will work, the present invention is most sensitive for checking contact when the voltage provided at each pad is at a specific intermediate voltage that has both of the complementary devices most turned on at once. That voltage is found by sweeping the voltage between a logical 1 and a logical 0 while measuring chip Idd as shown in FIG. 4. In the example of FIG. 4, Vdd for the SRAM chip was 3.3V. A logical zero ranged from 0V to 0.7V. A logical one varied from 2.4 to 3.3V. The mid level region, between 0.7V and 2.4 volts was the region of significantly higher Idd current. Idd current peaked at a voltage between about 1.3 and about 1.4V, which is about the middle of the mid level region. Once the voltage providing the highest Idd current has been found for a particular technology, that single voltage can then be used in subsequent testing to save time. Alternatively, a voltage sweep can be performed over the mid level region, for example from about 1.2 to about 1.5V.

Figure 5:
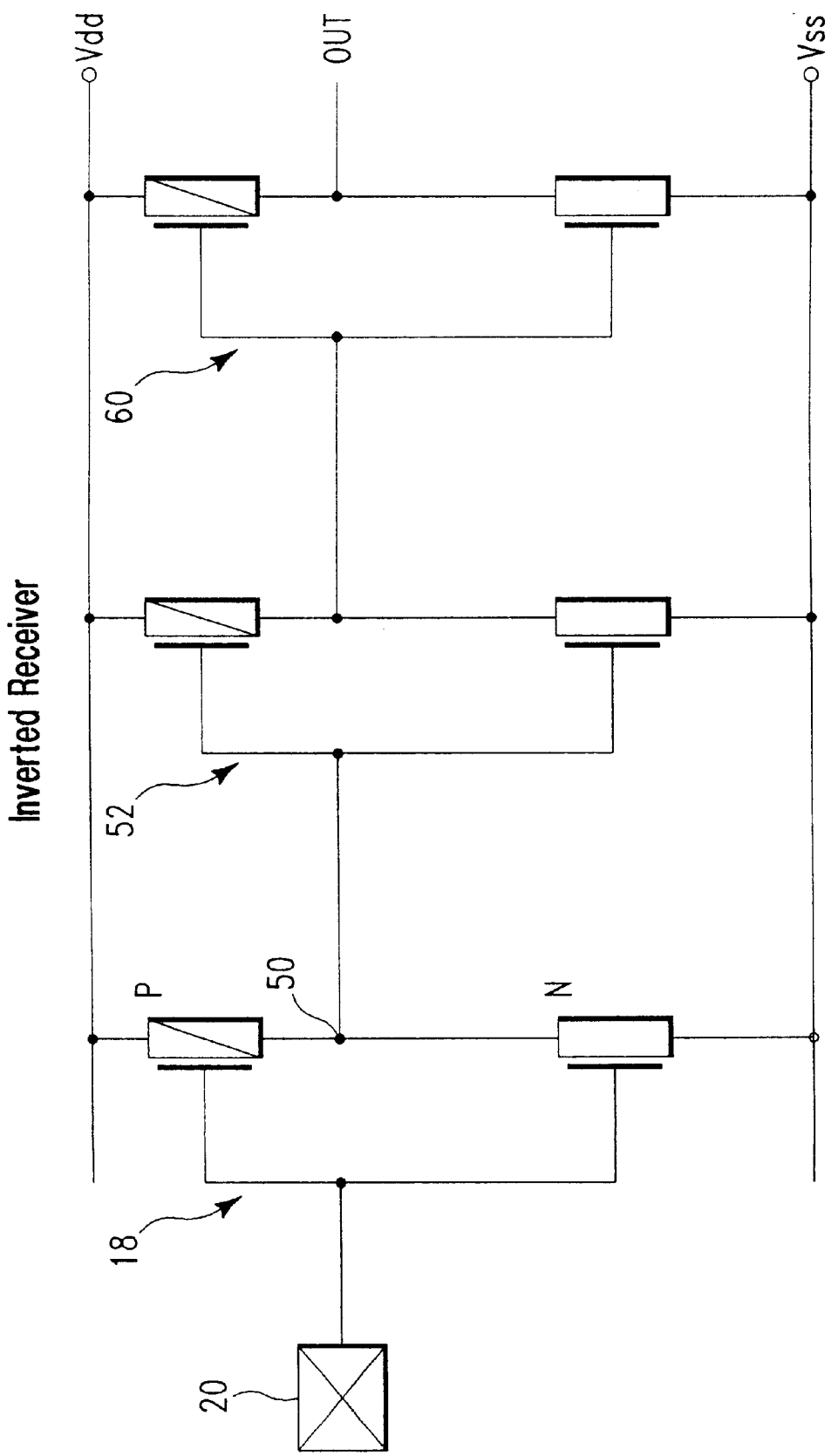
FIG. 5 is a circuit diagram of a CMOS inverter receiver input circuit including a complementary pair of transistors and additional circuits to which the input circuit is connected.

The present inventors have found that for dynamic and static RAM memory chips, measured Idd leakage current increased by from about 1 ma to about 5 ma when voltage applied to a single input pad was swept through the mid level region as compared with Idd leakage at Vdd or ground. The increase in Idd current strongly depends on the intermediate voltage applied, the type of receiver circuit, and the device design (including gate width, length, doping, gate oxide thickness). The inventors also found, as shown in FIG. 5, that, since output 50 of receiver 18 was also at an intermediate voltage, inverter circuit 52, to which output 50 was connected, was also partially turned on, and the currents drawn by both receiver 18 and inverter circuit 52 added to the overall Idd current drawn by the chip. Similarly, inverters and other circuits 60 in the cascade of circuits following receiver 18 and inverter circuit 52 may be partially turned on, adding to chip Idd current. However, since the mid level output voltage of inverter 18 is not necessarily equal to the mid level voltage applied to pad 20, currents drawn by succeeding stages of devices may be significantly lower than the current drawn by the first input devices. This drop off in current as applied voltage varies from mid level is shown in the data for the SRAM of FIG. 4.

Figure 6:
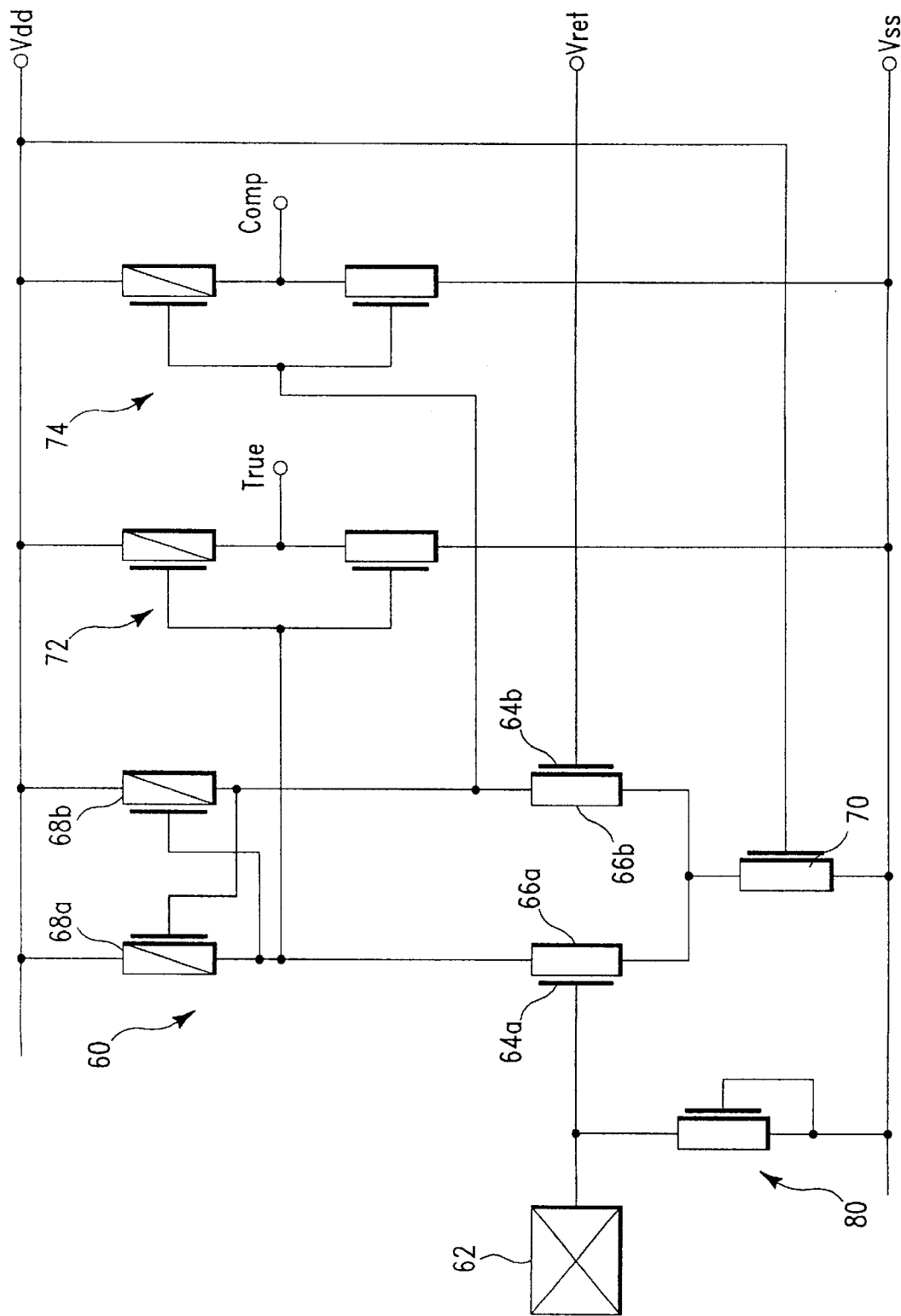
FIG. 6 is a circuit diagram of a CMOS current switch receiver input circuit.

The present invention is also applicable to current switch receiver 60, as shown in FIG. 6. In this type of receiver, input pad 62 is connected with gate 64a of NFET 66a while reference voltage Vref is applied to gate 64b of identical NFFT 66b. For a chip having a Vdd of 3.3V, Vref was 0.7V.

Figure 7:
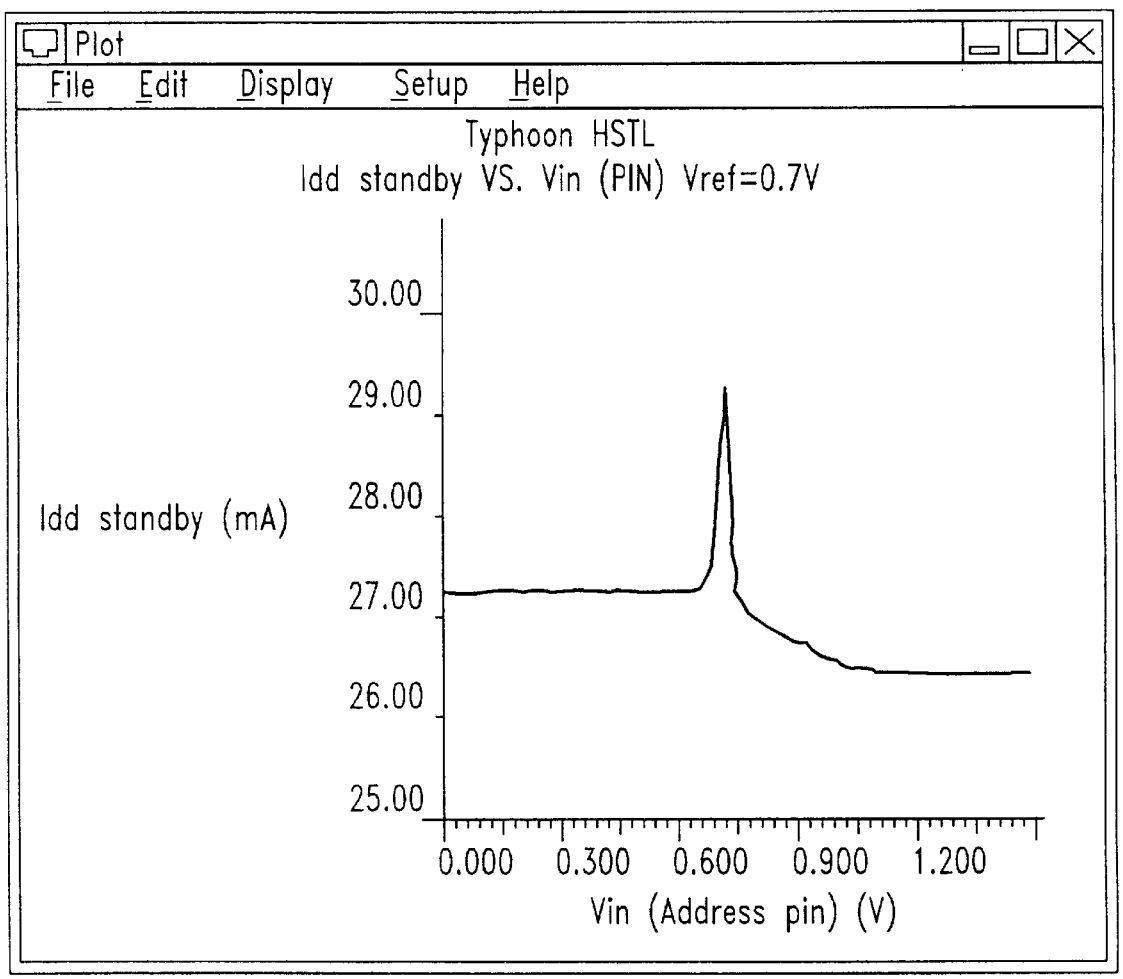
FIG. 7 is a graph showing how Idd current varied with voltage applied to a single input pad having a current switch receiver input circuit on an SRAM chip.

Logical zero was in the range from 0 to 0.6V and logical one in the range from 0.8 to 1.5V. For inputs at pad 62 of either a logical zero or a logical 1, cross coupled PFETs 68a, 68b and source transistor 70 ensure that inputs to inverters 72 and 74 are of opposite logical level. However, if a mid level input is provided at pad 62 that is close to or equal to Vref, then inverters 72 and 74 will both be partially in an on state, drawing much larger current than when a logical level is applied to pad 62. As shown in FIG. 7, because of cross coupled PFETs 68a, 68b, current switch receiver 60 draws significantly less Idd current at mid level and in a significantly narrower range of applied voltage than the inverter type receiver of FIG. 4.

Also illustrated in FIG. 6 is snap back diode 80 that provides ESD protection to receiver 60 while not providing a path for checking contact.

While several embodiments of the invention, together with modifications thereof, have been described in detail herein and illustrated in the accompanying drawings, it will be evident that various further modifications are possible without departing from the scope of the invention. For example, while the invention is intended for use on floating inputs for which a diode cannot be measured, the invention can also be used to check contact to pads for which there is a measurable diode. Nothing in the above specification is intended to limit the invention more narrowly than the appended claims. The examples given are intended only to be illustrative rather than exclusive.

What is claimed is:

1. A method of testing, comprising the step of:
   (a) providing a CMOS integrated circuit chip comprising a plurality of I/O pads for external contact, said I/O pads connected to gates of transistors;
   (b) providing a logical high or a logical low voltage to all but a first of said plurality of pads and applying an intermediate voltage exclusively to said first of said pads to partially turn on a first of said transistors; and
   (c) measuring chip Idd standby current while said intermediate voltage is being provided to said first pad.

2. The method as recited in claim 1, wherein in said providing step (a), one said pad is connected to gates of complementary pairs of CMOS transistors and wherein in said providing step (b), said intermediate voltage partially turns on both transistors of said CMOS pair.

3. The method as recited in claim 1, wherein in said providing step (a), said first pad is connected to a current switch receiver.

4. The method as recited in claim 1, further comprising in said providing step (b) the step of contacting said pads with probes for electrical testing.

5. The method as recited in claim 1, further comprising the step of providing a logical high or logical low voltage to each said pad and performing a second measurement of Idd standby current, and detecting a difference between said first measurement and said second measurement.

6. The method as recited in claim 5, wherein if a difference between said first measurement and said second measurement is not detected, a fail is indicated for contact to said pad of said step (b).

7. The method as recited in claim 6, further comprising the step of fixing probe contact and repeating the measurement of said steps (b) and (c).

8. The method as recited in claim 5, further comprising the step of providing said intermediate voltage to a second pad to partially turn on a second transistor and performing a third measurement of Idd standby current while said intermediate voltage is being provided to said second pad, and detecting a difference between said third measurement and said second measurement.

9. The method as recited in claim 1, wherein said chip comprises a back insulator.

10. The method as recited in claim 9, wherein said chip comprises SOI.

11. The method as recited in claim 9, wherein said first pad contacts a floating gate.

12. A method of testing, comprising the steps of:
    a) contacting a CMOS integrated circuit chip having a plurality of I/O pads, each said I/O pad having a first and a second logical level;
    b) providing power and ground rail voltages to said chip;
    c) providing one said logical voltage level to all I/O pads of said chip and measuring a parameter of said chip;
    d) providing a voltage intermediate between said first and said second logical voltage levels to one of said I/O pads of said chip and measuring said chip parameter; and
    e) detecting a change in said chip parameter from said step (c) to said step (d).

13. The method as recited in claim 12, wherein said chip parameter is chip Idd current.

14. The method as recited in claim 12, said method further comprising the step of sequentially providing said steps (d) and (e) to each I/O pad of said chip.

15. The method as recited in claim 12, wherein if, in said step (e), a change in said parameter is not detected, a fail is indicated for contact to said input of said step (d).

16. The method as recited in claim 15, further comprising the step of fixing probe contact and repeating the measurement of said steps (d) and (e).

17. The method as recited in claim 12 wherein in said contacting step (a), one said pad is connected to gates of complementary pairs of CMOS transistors, and wherein in said providing step (d), said intermediate voltage partially turns on both transistors of said CMOS pair.

18. The method as recited in claim 12, wherein in said providing, step (a), one said pad is connected to a current switch receiver.

19. The method as recited in claim 12, wherein said chip comprises a back insulator.

20. The method as recited in claim 19, wherein said chip comprises SOI.

21. The method as recited in claim 19, wherein in said providing step (d) said one I/O pad provided with an intermediate voltage contacts a floating gate.

* * * * *